United States Patent
Sun et al.

(10) Patent No.: US 12,527,042 B2
(45) Date of Patent: Jan. 13, 2026

(54) VDMOS DEVICE AND METHOD FOR FABRICATING THE SAME

(71) Applicant: SILICON-MAGIC SEMICONDUCTOR TECHNOLOGY (HANGZHOU) CO., LTD., Hangzhou (CN)

(72) Inventors: He Sun, Hangzhou (CN); Jiakun Wang, Hangzhou (CN)

(73) Assignee: SILICON-MAGIC SEMICONDUCTOR TECHNOLOGY (HANGZHOU) CO., LTD., Hangzhou (CN)

( * ) Notice: Subject to any disclaimer, the term of this patent is extended or adjusted under 35 U.S.C. 154(b) by 598 days.

(21) Appl. No.: 17/957,790

(22) Filed: Sep. 30, 2022

(65) Prior Publication Data
US 2023/0124282 A1    Apr. 20, 2023

(30) Foreign Application Priority Data
Oct. 20, 2021   (CN) .......................... 202111224609.3

(51) Int. Cl.
| | |
|---|---|
| H10D 62/10 | (2025.01) |
| H01L 21/265 | (2006.01) |
| H01L 21/266 | (2006.01) |
| H10D 30/01 | (2025.01) |
| H10D 30/66 | (2025.01) |
| H10D 62/17 | (2025.01) |

(52) U.S. Cl.
CPC ..... *H10D 62/109* (2025.01); *H01L 21/26513* (2013.01); *H01L 21/266* (2013.01); *H10D 30/0291* (2025.01); *H10D 30/665* (2025.01); *H10D 62/107* (2025.01); *H10D 62/127* (2025.01); *H10D 62/393* (2025.01)

(58) Field of Classification Search
CPC .. H10D 30/0291; H10D 30/66; H10D 30/662; H10D 30/665; H10D 62/106; H10D 62/107; H10D 62/109; H10D 62/127; H10D 62/157; H10D 62/393
USPC ....................................................... 257/329
See application file for complete search history.

(56) References Cited

U.S. PATENT DOCUMENTS

2017/0338303 A1* 11/2017 Bolotnikov ............ H10D 30/65

* cited by examiner

*Primary Examiner* — Fazli Erdem
(74) *Attorney, Agent, or Firm* — Osha Bergman Watanabe & Burton LLP

(57) ABSTRACT

A VDMOS device and a fabrication method thereof are provided. The device includes unit cells which jointly form a cellular structure. The cellular structure includes spaced-apart source regions and surrounding gate regions. Some gate regions overlap to form gate intersections comprising separation regions; the others form non-intersecting gate regions. Each unit cell has a JFET region corresponding in position to one non-intersecting gate region and a JFET shielding region corresponding in position to one gate intersection. The difference in doping concentrations of different types of dopants in the JFET shielding region surpasses difference in doping concentrations in the JFET regions and therefore depletion layers disposed along diagonals of the gate intersections expand and merge more easily, thereby increasing breakdown voltage along the diagonals. Therefore, the device exhibits enhanced voltage tolerance and stability.

7 Claims, 13 Drawing Sheets

VDMOS DEVICE AND METHOD FOR FABRICATING THE SAME

TECHNICAL FIELD

The present disclosure relates to semiconductor devices and, more particularly, to a VDMOS device and a method for fabricating the same.

BACKGROUND

A vertical double-diffused metal oxide semiconductor device (VDMOS) is a voltage-controlled device with electric currents flowing vertically in the transistor. The VDMOS device is controlled by an appropriate gate voltage to produce a channel under the gate layer, in which an electric current can flow between a drain and a source. The VDMOS device has advantages such as a high switching speed, a small switching loss, a high input impedance, and a low driving power, and thus is widely applicable to inverters, switching power supplies, and electronic ballasts.

In general, the VDMOS device fabrication process has a step that forms a junction-gate field-effect transistor JFET region under the gate by applying the ion implantation process. When the VDMOS device adopts a cellular structure and includes cells arranged in an array, the regions take on regular polygonal shapes where gate regions intersect each other (hereinafter, gate intersections). Since JFET regions are formed by implanting dopants under each of the gate regions, the gate intersections get higher dopant concentrations implanted underneath so that corresponding JFET regions under the gate intersections have larger widths along the diagonals of the gate intersections than the widths of the JFET regions under gate regions other than the gate intersections. As a result, depletion layers formed by PN junctions at two ends of each of the JFET regions under the gate intersections are unlikely to get in contact with each other. Therefore the VDMOS device has a lowered breakdown voltage along the diagonals and may even have leakage currents at these locations.

SUMMARY

The present disclosure provides a VDMOS device, comprising a plurality of unit cells, wherein the unit cells jointly form a cellular structure, the cellular structure comprises a plurality of source regions spaced apart from each other and a plurality of gate regions, and the plurality of gate regions comprises gate regions from a first group and gate regions from a second group, wherein the gate regions from the first group extend in a first direction, and the gate regions from the second group extend in a second direction perpendicular to the first direction, wherein each of the plurality of source regions is positioned between two adjacent gate regions from the first group and two adjacent gate regions from the second group, wherein each gate region from the first group overlaps with one or more of gate regions from the second group, regions where the gate regions overlap with each other are gate intersections, and regions of the gate regions with no overlapping are non-intersecting gate regions, wherein separation regions are defined in the gate intersections, wherein each of the unit cells each has a JFET region below one of the non-intersecting gate regions and a JFET shielding region below one of the gate intersections, the JFET region is of the same dopant type as the JFET shielding region, and the JFET region has a higher doping concentration than the JFET shielding region.

In an embodiment, boundaries of the separation regions fall within boundaries of the gate intersections, and each gate intersection has an area equal to or larger than that of the separation regions corresponding to the gate intersection.

In an embodiment, each of the unit cells comprises: a semiconductor base comprising a substrate, which is of a first dopant type, and an epitaxial layer disposed on the substrate, wherein the epitaxial layer is of the first dopant type, and the substrate is a drain region of the VDMOS device; the JFET region, which is of the first dopant type, wherein the JFET region is formed in the epitaxial layer, below one of the non-intersecting gate regions, and extends from an upper surface of the epitaxial layer toward the substrate; the JFET shielding region, which is of the first dopant type, wherein the JFET shielding region is formed in the epitaxial layer below one of the gate intersections; well regions, which are of a second dopant type, wherein the well regions are disposed in the epitaxial layer and at side of one of plurality of gate regions, wherein sidewalls of the well regions are in contact with sidewalls of the JFET region; source regions, which are of the first dopant type, wherein the source regions are disposed in the well regions and positioned proximate to the JFET region; a contact body region, which is of the second dopant type, wherein the contact body region is disposed in one of the well regions, wherein sidewalls of the contact body region are in contact with sidewalls of the source regions; a gate disposed in one of the gate region on the upper surface of the epitaxial layer and comprising a gate electrode and a gate dielectric layer, wherein the gate is in contact with the JFET region, the well regions, and the source regions; source electrodes, wherein the source electrodes are metal layers connecting to the source regions and the contact body region; and a drain electrode, disposed on a surface of the substrate facing away from the epitaxial layer.

In an embodiment, the JFET shielding region is part of the epitaxial layer and has the same doping concentration as the epitaxial layer.

In an embodiment, the well regions have a higher doping concentration than the JFET region, and the JFET region has a higher doping concentration than the epitaxial layer.

In an embodiment, a difference in doping concentration between the well regions and the JFET region is less than a difference in doping concentration between the well regions and the epitaxial layer.

In an embodiment, a depth of the JFET region along the direction in which the JFET region extends toward the substrate is not greater than that of the well regions.

The present disclosure provides a method for fabricating a VDMOS device, comprising: forming an epitaxial layer, which is of a first dopant type and disposed on a substrate, which is of the first dopant type, wherein the substrate is a drain region of the VDMOS device; forming JFET regions and JFET shielding regions in the epitaxial layer to form a cellular structure, wherein the JFET regions are of a first dopant type and the JFET shielding regions are of the first dopant type, wherein the JFET regions are formed in regions of the epitaxial layer corresponding to the non-intersecting gate region, the JFET shielding regions are formed in regions of the epitaxial layer corresponding to the gate intersection, the JFET regions are spaced apart by the JFET shielding regions, and the JFET regions have a higher doping concentration than the JFET shielding regions; forming gates on an upper surface of the epitaxial layer and in the gate regions, wherein each of the gates comprises a gate dielectric layer and a gate electrode; forming well regions on two sides of each gate, wherein the well regions are of a second dopant type, and upper surfaces of the well regions are partially in contact with the gate, and sidewalls of the well regions are in contact with sidewalls of one of the JFET regions; forming source regions in the well regions, wherein the source regions are of the first dopant type and positioned proximate to one of the JFET regions, wherein upper surfaces of the well regions are in contact with the gates; forming a contact hole in one of well regions between two adjacent gates by etching, wherein the contact hole is filled with materials doped with dopants of the second dopant type to form a contact body region; forming source electrodes, connected to the source regions and the contact body region; and forming a drain electrode on a surface of the substrate facing away from the epitaxial layer.

In an embodiment, before forming the JFET regions, the method further comprises: forming a voltage-dividing ring structure in the epitaxial layer and an active region.

In an embodiment, the forming the JFET regions comprises: performing ion implantation on the upper surface of the epitaxial layer at positions corresponding to the non-intersecting gate regions.

In an embodiment, the forming the JFET shielding regions comprises: covering regions of the upper surface of the epitaxial layer corresponding to the gate intersections with a mask and then performing ion implantation on the upper surface of the epitaxial layer; or performing ion implantation in the regions of the upper surface of the epitaxial layer corresponding to the gate intersections to form the JFET shielding regions, wherein the JFET shielding regions has a lower doping concentration than the JFET regions.

As described above, the present disclosure provides a VDMOS device and a method for fabricating the same, characterized by the following: performing JFET implantation on an epitaxial layer at positions corresponding non-intersecting gate region to form JFET regions, and forming JFET shielding regions in the epitaxial layer, with the FET shielding regions corresponding in position to gate intersections; the difference in concentration between different dopant ions in the JFET shielding region surpasses that in the JFET region, and thus depletion layers formed near the JFET shielding regions have a larger width than depletion layers formed near the JFET regions along diagonals of the gate intersections, so as to enhance contact and merge of the depletion layers at the two ends of each JFET shielding region and increase breakdown voltage along the diagonals of the gate intersections. Therefore, the device exhibits enhanced voltage tolerance and stability.

DETAILED DESCRIPTION

Figure 1:
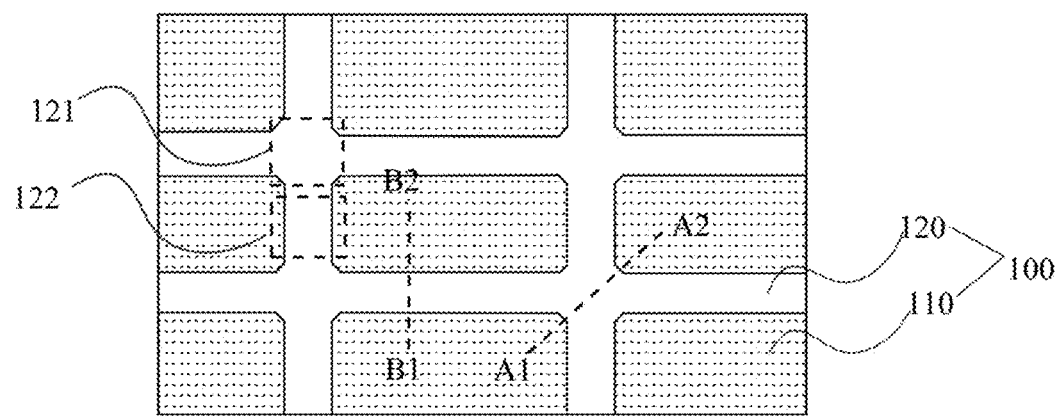
FIG. 1 shows a top view of a cellular structure of an existing VDMOS device.

The present disclosure is hereunder illustrated by specific embodiments to enable persons skilled in the art to easily gain insight into the other advantages and effects of the disclosure. The disclosure can be implemented or applied in accordance with any other variant embodiments. Details presented herein may be modified or changed from different perspectives and for different applications without departing from the spirit of the disclosure. Combinations of the following embodiments and features therein will be possible unless otherwise contradictory.

The present disclosure is depicted by the accompanying drawings and further described hereunder. In the accompanying drawings, like reference numerals designate like elements. For the sake of illustration, the elements of the drawings are not necessarily drawn to scale relative to each other. It is possible that some well-known elements are not shown in the drawings. For the sake of brevity, it is also possible that an intermediate semiconductor structure which results from one or more steps is illustrated in a drawing.

When it comes to doping concentration in the disclosure, symbols "+" and "−" next to symbol "n" or "p" denote relative doping concentrations. For example, "n+" describes a highly-doped n-type region. However, regions denoted with the same symbols do not necessarily have the same absolute doping concentration. For instance, two highly-doped n-type regions may have the same absolute doping concentration or different absolute doping concentrations.

When the description of the structure of a device involves stating that a first layer or region is disposed on or above a second layer or region, it means that the first layer or region is disposed directly on the second layer or region, or that a third layer/region is disposed between the first layer/region and the second layer or region. Furthermore, if the device is turned upside down, the first layer or region will be disposed under or below the second layer or region.

In the disclosure, the term "semiconductor structure" is a collective term for all the intermediate semiconductor structures formed as a result of each step of fabricating a semiconductor device, including all the layers or regions formed as of the corresponding step. The term "laterally" means being substantially parallel to the substrate. The term "vertical" means being substantially perpendicular to the substrate.

A VDMOS device is a voltage-controlled electronic device and comprises an active region and a terminal region. The active region comprises a number of unit cells that are structurally identical or similar. Top view of the surfaces of the unit cells jointly form a cellular structure. The top surface of the cellular structure is parallel to a substrate of the device, which is referred to as the horizontal orientation sometimes in this description. The cellular structure comprises a plurality of source regions spaced apart from each other and gate regions surrounding the source regions.

FIG. 1 shows a top view of a cellular structure of an existing VDMOS device. As shown in FIG. 1, the cellular structure includes regular polygons arranged in an array. The cellular structure comprises a plurality of source regions 110 that are electrically connected in parallel and a plurality of gate regions 120. The gate regions 120 can be classified into a first group and a second group. Gate regions 120 from the first group extend in a first direction, gate regions 120 from the second group extend in a second direction perpendicular to the first direction, and they jointly form a grid, wherein each of the source regions 110 is positioned between two adjacent gate regions from the first group and two adjacent gate regions from the second group. Each gate region from the first group overlaps with one or more of gate regions from the second group, and vice versa. Regions where the gate regions 120 overlap with each other are defined as gate intersections 121; regions of the gate regions 120 with no overlapping are defined as non-intersecting gate regions 122. Each of the source regions 110 is in the shape of a square, a rectangle, or a hexagon, which is identical to the shape of each unit cell. Naturally, the gate intersections 121 are also in the shape of regular polygons. For example, when two perpendicular gate regions intersect with each other to form a gate intersection, the gate intersection is in the shape of a square or rectangle; when three gate intersections with each other to form a gate intersection, then the gate intersection is in the shape of a hexagon.

Figure 2A:
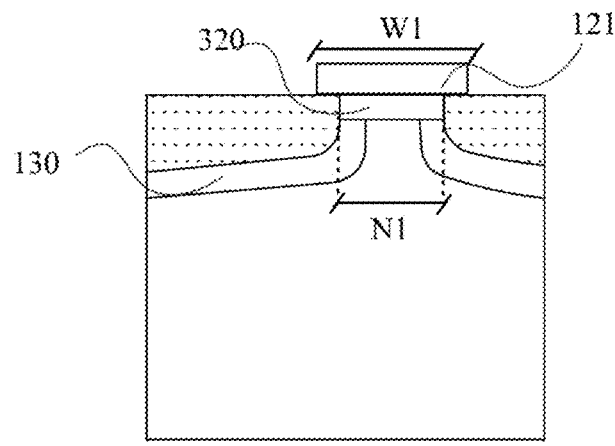
FIG. 2A shows a first cross sectional view of depletion layers of a unit cell in an existing VDMOS device.
Figure 2B:
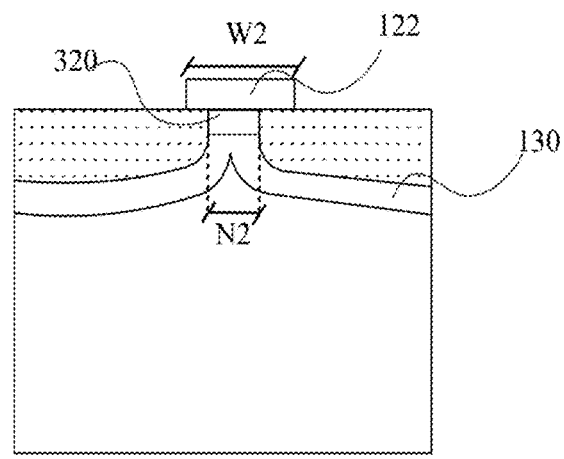
FIG. 2B shows a second cross sectional view of depletion layers of a unit cell in an existing VDMOS device.

FIG. 2A and FIG. 2B show cross sectional views of depletion layers of a unit cell in an existing VDMOS device. FIG. 2A shows the first cross sectional view of depletion layers of the unit cell in the VDMOS device, with the cutting plane passing through the line A1-A2; FIG. 2B shows the second cross sectional view of depletion layers of the unit cell in the VDMOS device, with the cutting plane passing through the line B1-B2. The first cross section intersects one of the gate intersections 121. The second cross section does not intersect any of the gate intersections 121. The line A1-A2 is substantially parallel to a diagonal of the gate intersections 121, and the line B1-B2 is substantially parallel to a direction in which one of the gate regions 120 extends.

The structure as shown by the first cross section is hereinafter referred to as the first structure and the structure as shown by the second cross section is hereinafter referred to as the second structure; in both of the two structures, there is a JFET region 320 and other regions (for example, sources 110) flanking the JFET region 320. Two PN junctions and corresponding depletion layers are formed between the JFET region 320 and the flanking regions. The depletion layers flank the JFET region and are opposite to each other. The concentration difference between P-type regions and N-type regions adjacent to the P-type region in all the JFET regions of the VDMOS device are the same; thus, even though the depletion layers of the JFET region in the first structure and the depletion layers of the JFET region in the second structure are of the same thickness, width W1 of the gate intersection 121 in the first structure is greater than width W2 of the non-intersecting gate region 122 in the second structure, and in consequence width N1 of the JFET region in the first structure is greater than width N2 of the JFET region in the second structure, allowing the depletion layers in the first structure and second structure to be of the same thickness. Therefore, upon contact and merge of the depletion layers flanking the PN junctions in the second structure, the depletion layers 130 flanking the PN junctions in the first structure are still spaced apart, and in consequence the first structure has a lower gate-drain breakdown voltage tolerance than the second structure; in other words, breakdown in the first structure is preceded by breakdown in the second structure, thereby reducing the voltage tolerance of the VDMOS device along the diagonals of the gate intersections 121.

Therefore, it is desirable to increase the width of the depletion layers in the VDMOS device along the diagonals of the gate intersections 121 and thus increase the gate-source breakdown voltage tolerance of the VDMOS device along the diagonals of the gate intersections 121 so as to increase the withstanding voltage of the VDMOS device. To this end, the disclosure provides a VDMOS device. The VDMOS device comprises an active region and a terminal region. The active region comprises a plurality of unit cells. The unit cells are structurally identical or similar. The unit cells jointly form a cellular structure of the VDMOS device. The cellular structure resembles an array.

Figure 3:
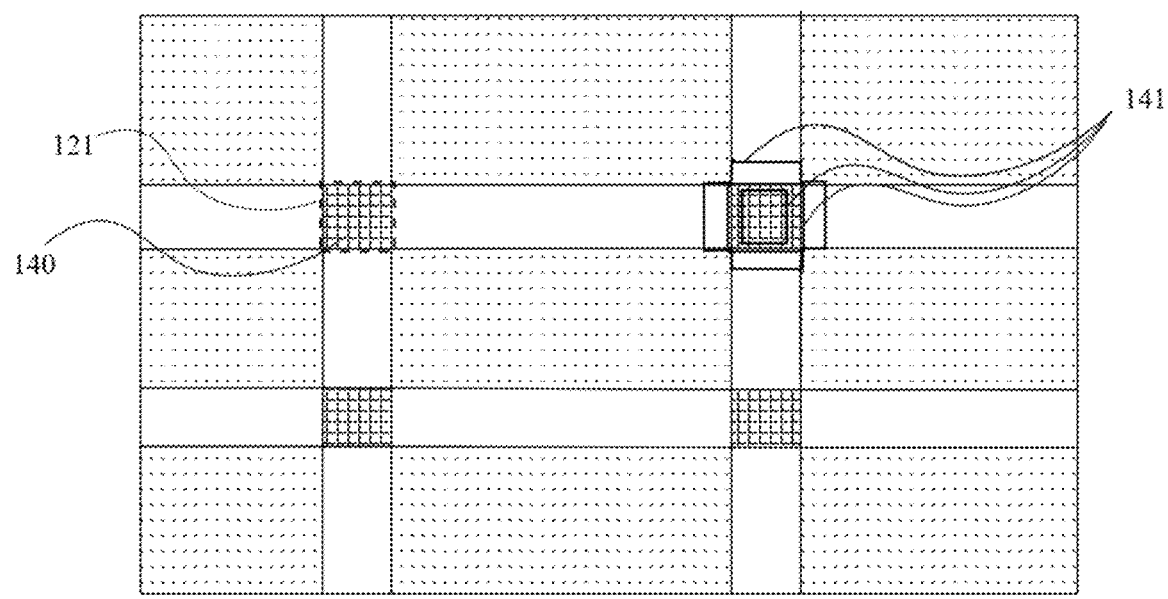
FIG. 3 shows a top view of a cellular structure of a VDMOS device according to an embodiment of the present disclosure.

FIG. 3 shows a top view of a cellular structure of the VDMOS device according to one embodiment of the present disclosure. As shown in FIG. 3, compared with conventional cellular structures, the VDMOS device of the present disclosure introduces one or more separation regions 140 for each gate intersection 121, wherein the separation regions 140 are respectively located inside the gate intersections 121, or merely overlap with the gate intersections 121. The separation regions 140 map where JFET shielding regions 390 are formed in each unit cell, wherein the JFET regions 320 are spaced apart by the JFET shielding regions 390. In an embodiment, the separation regions 140 have no physical forms and are concepts introduced to better describe the JFET shielding regions 390.

In an embodiment, as shown in the top view of the cellular structure, the separation regions 140 have the same boundaries as the gate intersections 121. For instance, if the boundary of a gate intersection 121 is a square, the boundary of the one or more separation regions 140 corresponding to the gate intersection 121 is also a square. In an embodiment, the boundary of each gate intersection 140 is different from that of the one or more separation regions 140 corresponding to the gate intersection 121.

In an embodiment, as shown in the top view of the cellular structure, the separation regions 140 coincide with the gate intersections 121; in other words, each gate intersection 121 has the same area as that of the one or more separation regions 140 corresponding to the gate intersection 121.

In an embodiment, as shown in the top view of the cellular structure, boundaries 141 of the separation regions 140 fall within corresponding gate intersections 121; in other words, each gate intersection 121 has an area larger than that of the one or more separation regions 140 corresponding to the gate intersection 121.

In an embodiment, as shown in the top view of the cellular structure, the boundaries 141 of the separation regions 140 fall outside of the corresponding gate intersection 121; in other words, each gate intersection 121 has an area smaller than that of the one or more separation regions 140 corresponding to the gate intersection 121.

Figure 4A:
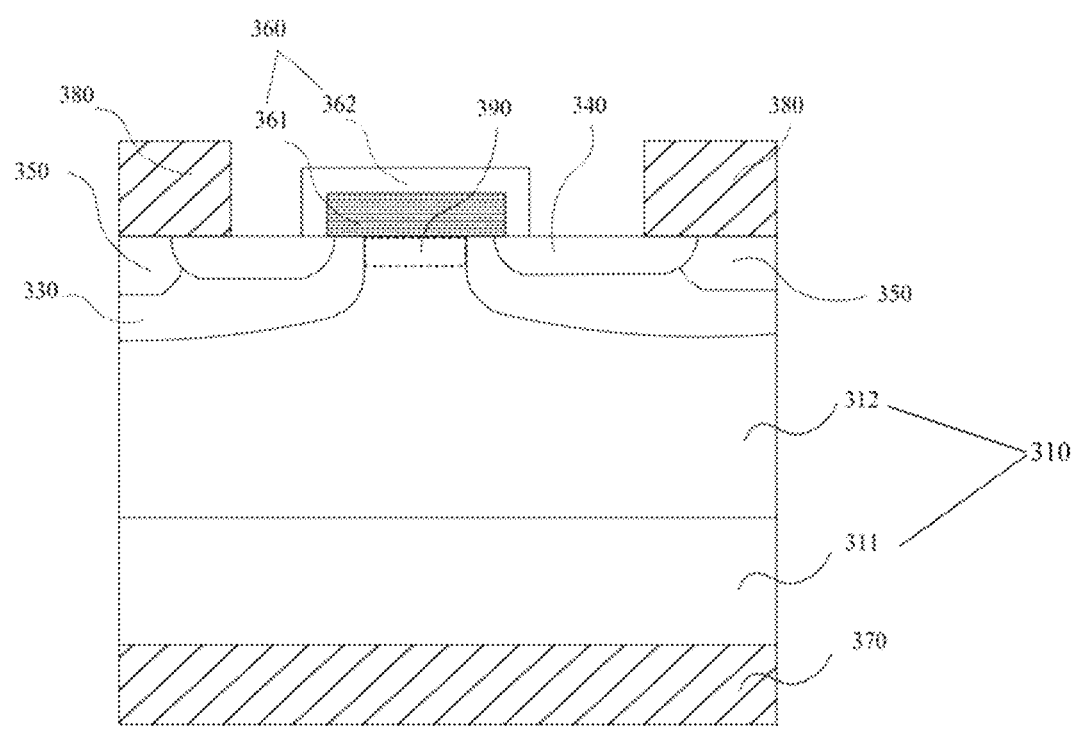
FIG. 4A shows the first cross sectional view of the depletion layers of a unit cell according to an embodiment of the present disclosure.

Refer to FIG. 4A, which shows structure the first cross sectional view of the depletion layers of the VDMOS device structure of the present disclosure; for ease of description, the first structure of the present disclosure has the same relative position as the first structure of the prior art within each respective VDMOS device; in other words, FIG. 4A is a first cross section of the VDMOS device of the present disclosure, with the cutting plane passing through a diagonal of the gate intersections 121.

As shown in FIG. 4A, the first structure of the VDMOS device comprises: a semiconductor base 310 comprising a substrate 311, which is of a first dopant type and an epitaxial layer 312 disposed on an upper surface of the substrate 311, wherein the epitaxial layer 312 is of the same dopant type as the substrate 311; a JFET shielding region 390, which is of the first dopant type and disposed in the epitaxial layer 312; well regions 330, which are of a second dopant type and disposed in the epitaxial layers 312, wherein the well regions 330 flank the JFET shielding region 320; source regions 340, which is of the first dopant type, disposed in the well regions 330, and positioned proximate to the JFET shielding region 390; a contact body region 350, which is of the second dopant type and disposed in the well regions 330, wherein sidewalls of the contact body region 350 are in contact with those of the source regions 34; a gate 360 disposed on an upper surface of the epitaxial layer 312; a drain electrode 370 disposed on a surface of the substrate 311 facing away from the epitaxial layer 312; and source electrodes 380. The source electrodes 380 are metal layers in contact with upper surfaces of the source regions 340 and the contact body regions 350, and connects the source electrodes 380 and the source regions 340.

The well regions 330 have a higher doping concentration than that of the JFET shielding region 390.

In an embodiment, the JFET shielding region 390 has the same doping concentration as the epitaxial layer 312; that is, the JFET shielding region 390 is part of the epitaxial layer 312.

The gate 360 covers upper surfaces of the JFET shielding region 390, the well regions 330, and part of upper surfaces of the source regions 340.

Figure 4B:
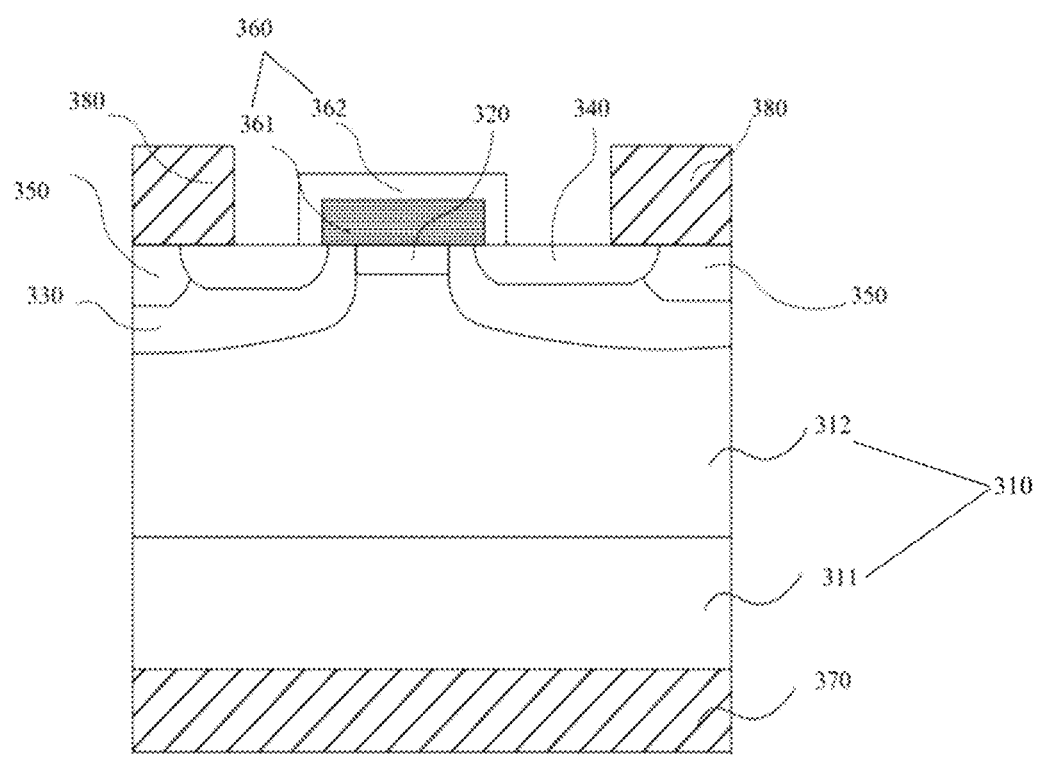
FIG. 4B is shows the second cross sectional view of the depletion layers structure of a unit cell according to an embodiment of the present disclosure.

FIG. 4B shows a cross-sectional view of a second structure of the VDMOS device of the present disclosure; for ease of description, the second structure of the present disclosure has the same relative position as the second structure of the prior art within each respective VDMOS device; in other words, FIG. 4B is a second cross section of the VDMOS device of the present disclosure, wherein the cutting plane passes through a non-intersecting gate region 122 and does not intersect any gate intersection 121.

As shown in FIG. 4B, the second structure comprises: a semiconductor base 310 comprising a substrate 311, which is of the first dopant type, and an epitaxial layer 312 disposed on an upper surface of the substrate 311, wherein the epitaxial layer 312 is of the same dopant type as the substrate 311; a JFET region 320, which is of the first dopant type and disposed in the epitaxial layer 312, wherein the JFET region 320 extends from an upper surface of the epitaxial layer 312 toward the substrate 311; well regions 330, which are of a second dopant type and disposed in the epitaxial layers 312, wherein the well regions 330 flank the JFET region 320, wherein sidewalls of the well regions 330 are in contact with sidewalls of the JFET region 320, such that PN junctions and depletion layers are formed between the well regions 330 and the JFET region 320; source regions 340, which are of the first dopant type, disposed in the well regions 330, and positioned proximate to the JFET region 320; a contact body region 350, which is of the second dopant type, and disposed in the well regions 330, wherein sidewalls of the contact body region 350 are in contact with sidewalls of the source regions 340; a gate 360 disposed on the upper surface of the epitaxial layer 312, wherein the gate 360 is in contact with the JFET region 320, the well regions 330, and the source regions 340; a drain electrode 370 disposed on a surface of the substrate 311 facing away from the epitaxial layer 312; and source electrodes 380, which are metal layers in contact with upper surfaces of the source regions 340 and the contact body region 350 so that the source electrodes 380 and the source regions 340 are connected.

The well regions 330 have a higher doping concentration than the JFET region 320. The JFET region 320 has a higher doping concentration than the JFET shielding region 390. The JFET region 320 has a higher doping concentration than the epitaxial layer 312.

In an embodiment, the JFET shielding region 390 has the same doping concentration as the epitaxial layer; that is, the JFET shielding region 390 is part of the epitaxial layer.

The gate 360 disposes on upper surfaces of the JFET region 320, the well regions 330, and part of upper surfaces of the source regions 340, in order to control the movement of charge carriers in a conducting channel.

In the present disclosure, the dopant type of a certain region is determined by the type of impurity atoms with which a neutral substrate is doped to form the certain region. For instance, a germanium or silicon semiconductor substrate is doped with group V elements (providing electrons), such as nitrogen, phosphorus and arsenic, to form a n-type substrate, and a germanium or silicon semiconductor substrate is doped with group III elements (providing holes), such as boron and aluminum, to form a p-type substrate. In an example, p-type is the first dopant type, and the second dopant type is n-type. In another example, n-type is the first dopant type, and the second dopant type is p-type. The substrate 311, which is of the first dopant type, is a heavily-doped substrate with a doping concentration of $10^{19}$ cm$^{-3}$ or above. The epitaxial layer 312, which is also of the first dopant type, is a lightly-doped epitaxial layer with a lower doping concentration (for example, $10^{16}$~$10^{17}$ cm$^{-3}$) than that of the substrate 311.

In an embodiment, the gate 360 comprises a gate dielectric layer 361 and a gate electrode layer 362 disposed on the gate dielectric layer 361. The gate dielectric layer 361 includes an oxide layer, an interlayer dielectric, or any other insulating material. The gate electrode 362 may be made of polycrystalline silicon, metal or any other conductive material.

Figure 5:
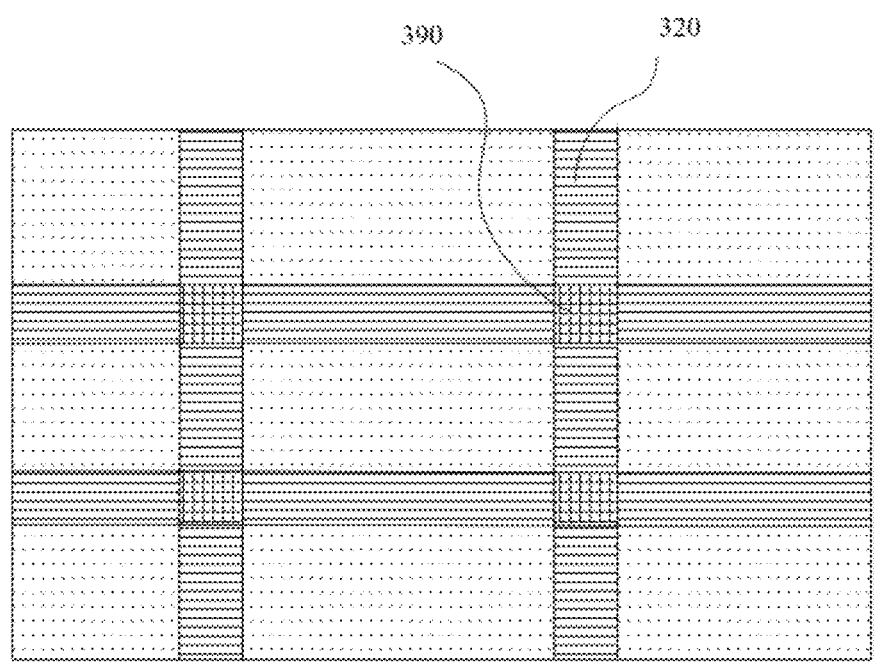
FIG. 5 shows a top view of JFET regions and JFET partition regions in an epitaxial layer according to an embodiment of the present disclosure.

An exemplary layout of multiple JFET regions 320 and multiple JFET shielding regions 390 is described below. FIG. 5 shows a top view of the exemplary layout of the JFET regions 320 and the JFET shielding regions 390 in the epitaxial layer 312. As shown in FIG. 5, the JFET regions 320 in the epitaxial layer 312 correspond in position to the non-intersecting gate regions 122, respectively. The layout of the JFET regions 320 in an upper portion of the epitaxial layer is identical to the layout of the non-intersecting gate regions 122 in the cellular structure.

In an embodiment, each of the JFET regions 320 in the upper portion of the epitaxial layer 312 have the same length and width as those of a corresponding non-intersecting gate region 122 in the cellular structure.

In an embodiment, the JFET shielding regions 390 in the epitaxial layer 312 correspond in position to the separation regions 140, respectively. The layout of the JFET shielding regions 390 in the upper portion of the epitaxial layer 312 is identical to the layout of the separation regions 140 in the cellular structure.

In an embodiment, both the JFET regions and the JFET shielding regions 390 are formed by JFET ion implantation, the JFET shielding regions 390 are of the same dopant type as the JFET regions 320, and the JFET shielding regions 390 have a lower doping concentration than the JFET regions 320. In another embodiment, the JFET shielding regions 390 are formed without JFET ion implantation, and thus the JFET shielding regions 390 are part of the epitaxial layer 312, thereby allowing the JFET regions 320 to be spaced apart by the epitaxial layer 312.

In an embodiment of the present disclosure, the JFET regions 320 and the JFET shielding regions 390 are both of the first dopant type. First PN junctions and first depletion layers 131 corresponding to the first PN junctions are formed between the JFET shielding regions 390 and the well regions 330. Second PN junctions and second depletion layers 132 corresponding to the second PN junctions are formed between the JFET regions 320 and the well regions 330.

Figure 6A:
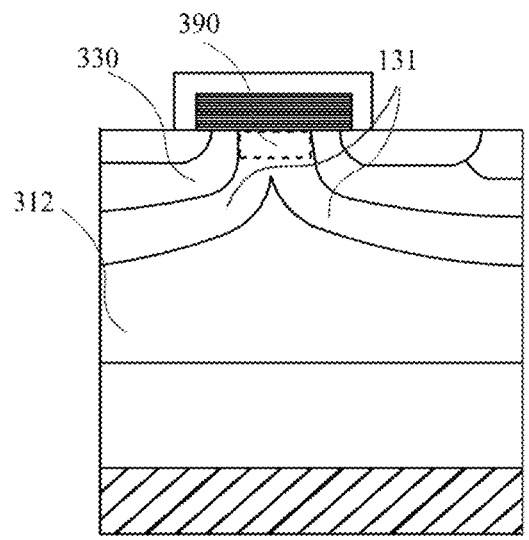
FIG. 6A shows the first cross sectional view of the first depletion layers in the first structure according to an embodiment of the present disclosure.
Figure 6B:
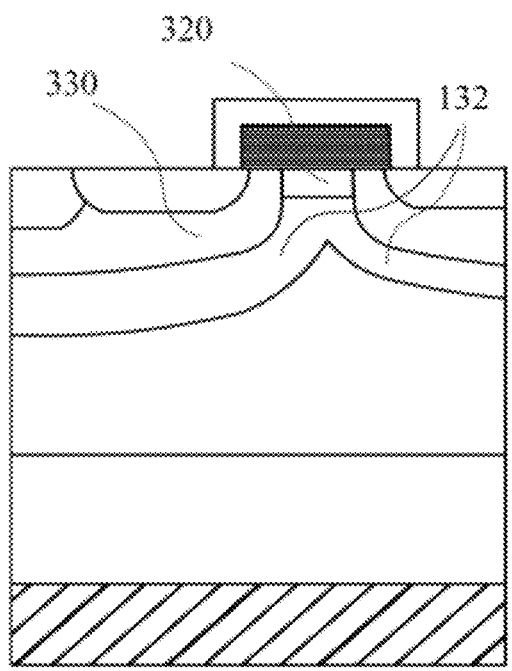
FIG. 6B shows the second cross sectional view of the second depletion layers in the second structure according to an embodiment of the present disclosure.

FIG. 6A shows the first cross sectional view of the depletion layers in the first structure and, and FIG. 6B shows the second cross sectional view of the depletion layers in the second structure.

As shown in FIG. 6A, the first depletion layers 131 are disposed between the well regions 330 and the JFET shielding region 390. The first depletion layers 131 thus formed expand toward the JFET shielding region 390, which has a relatively low doping concentration, because the well regions 330 have a higher doping concentration than the JFET shielding region 390.

In an embodiment, when the JFET shielding region 390 is part of the epitaxial layer 312, the first depletion layers 131 expand toward the epitaxial layer 312, which has a relatively low doping concentration.

As shown in FIG. 6B, the second depletion layers 132 are disposed between the well regions 330 and the JFET region 320. The second depletion layers 132 thus formed expand toward the JFET region 320, because the well regions 330 have a higher doping concentration than the JFET region 320.

Since the JFET region 320 has a higher doping concentration than the JFET shielding region 390, widths of the first depletion layers 131 along the a diagonal of the corresponding gate intersection 121 are greater than widths of the second depletion layers 132 along a width direction of the JFET region 320; in other words, the first depletion layers 131 near the JFET shielding region 390 have larger widths than the second depletion layers 131 near the JFET region 320. As a result, it's easier for the first depletion layers 132 to merge, thereby increasing the breakdown voltage of the VDMOS device along diagonals of the gate intersections 121 and decreasing the difference between the breakdown voltage of the JFET region 320 and the breakdown voltage of the JFET shielding region 390 along the diagonals of the gate intersections. Therefore, the negative impact of the cellular structure on the breakdown voltage along the diagonals of the gate intersections 121 is compensated for.

The difference between the width of the JFET shielding region 390 in the first structure and the width of the JFET region 320 in the second structure is positively associated with the difference in doping concentration between the well regions 33 and the JFET shielding region 390. Thus, the difference in doping concentration between the well regions 330 and the JFET shielding region 390 increases with the width difference, thereby helping the first depletion layers 131 under the corresponding gate intersection 121 to merge.

In one or more embodiments, the depth of the JFET region 320 along the direction in which the JFET region 320 extends toward the substrate 311 is not greater than that of the well regions 330.

The present disclosure further provides a method for fabricating a VDMOS device. The method is applicable to fabrication of any VDMOS device disclosed in the aforesaid embodiments. Thus, related structural descriptions disclosed in the aforesaid embodiments may apply to the method as well.

FIG. 7A through FIG. 7F are schematic cross-sectional views of intermediate structures obtained in each step of the method for fabricating the VDMOS device.

Figure 7A:
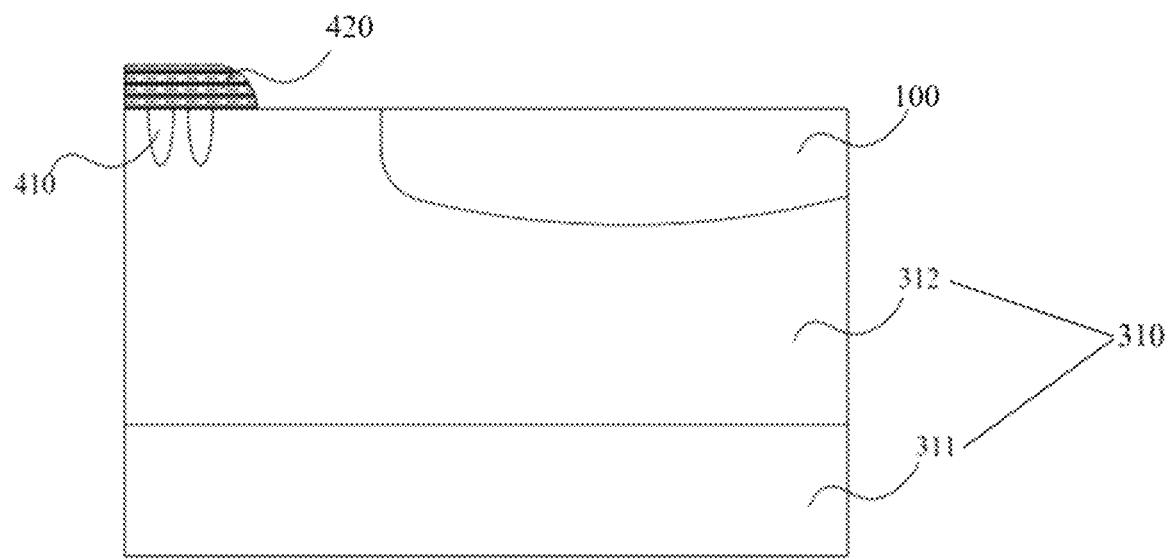
FIGS. 7A~7F are schematic cross-sectional views of the intermediate structures obtained in each step of a method for fabricating a VDMOS device according to an embodiment of the present disclosure.

As shown in FIG. 7A, a semiconductor base 310 is first provided. The semiconductor base 310 comprises a substrate 311, which is of the first dopant type, and a epitaxial layer 312, which is of the first dopant type. The epitaxial layer 312 is formed on an upper surface of the substrate 311. At least one voltage-dividing ring 410 is formed in the epitaxial layer 312 by etching and ion implantation. A field oxide layer 420 is formed over a predetermined region of the epitaxial layer 312. The predetermined region is located at a periphery of the VDMOS device, and subsequently an active region 100 is formed in a central area of the VDMOS device.

The active region 100 is formed through the steps described below. For simplicity's sake, drawings related to the subsequent steps show only some of the structural features in the active region 100.

Figure 7B:
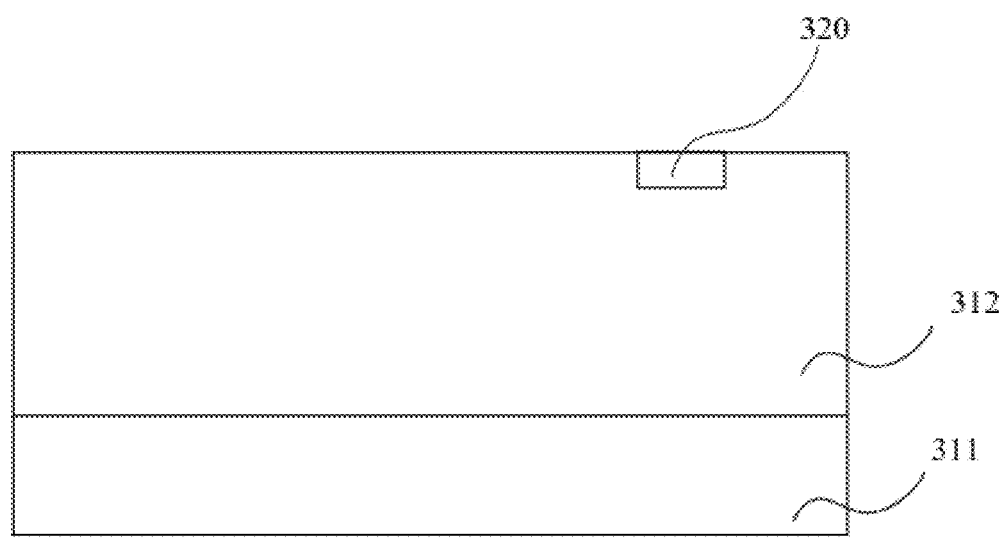
Figure 7B:
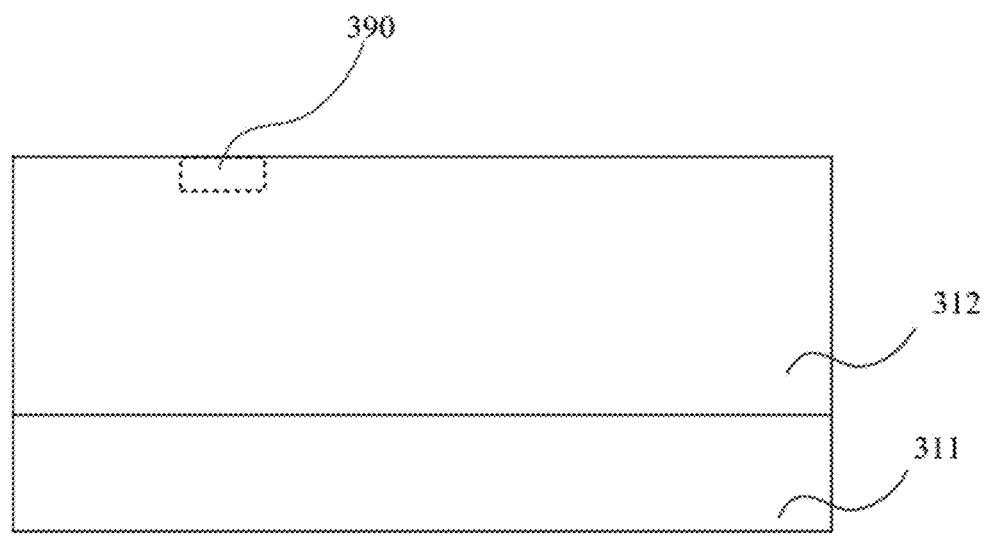

JFET regions and JFET shielding regions are formed in the epitaxial layer 312 to form the cellular structure as described in previous embodiments. As shown in FIG. 7Ba, JFET ion implantation is performed in regions of the epitaxial layer 312 corresponding to the non-intersecting gate region 122 described in previous embodiment in order to form the JFET regions 320, which are spaced apart in the epitaxial layer 312. As shown in FIG. 7Bb, JFET ion implantation is not performed in regions of the epitaxial layer 312 corresponding the separation regions 140 described in previous embodiment to form the JFET shielding regions 390, allowing the JFET regions 320 to be spaced apart by the JFET shielding regions 390. As an example, the JFET shielding regions 390 have the same doping concentration as the epitaxial layer 312. As an example, the JFET regions 320 have a higher doping concentration than the epitaxial layer 312.

In an embodiment, the JFET shielding regions 390 are formed by performing JFET ion implantation in regions of the epitaxial layer 312 corresponding the separation regions 140 described in previous embodiment to form the JFET shielding regions 390, and the JFET shielding regions 390 have a lower doping concentration than the JFET regions 320.

The JFET ion implantation entails performing an ion implantation process to implant ions of the first dopant type onto the upper surface of the epitaxial layer 312 and thereby form the JFET regions 320 and/or the JFET shielding regions 390.

Figure 7C:
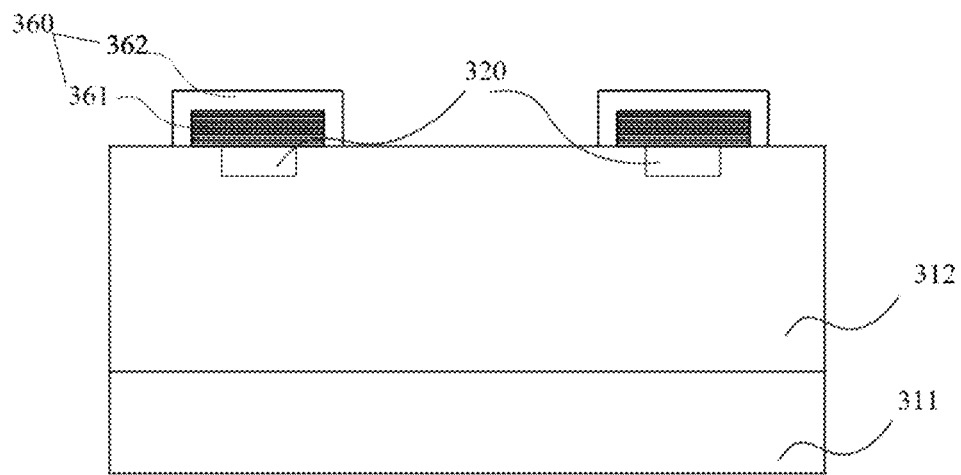

As shown in FIG. 7C, according to the cellular structure of the VDMOS device, gates 360 are formed on the upper surface of the epitaxial layer 312. The layout of the gates 360 on the upper surface of the epitaxial layer 312 is identical to the layout of the gate regions 120 in the cellular structure. Each gate 360 covers a corresponding JFET region 320 or a corresponding JFET shielding region 390. Each gate 360 has a larger width than the JFET region 320 corresponding to the gate 360.

Each gate 360 includes a gate dielectric layer 361 formed on an upper surface of the corresponding JFET region 320, and a gate electrode 362 formed on an upper surface of the gate dielectric layer 361. A polycrystalline silicon layer is first deposited over the epitaxial layer 312 and the gate dielectric layer 361 and then etched, such that only the part of the polycrystalline silicon layer above the JFET region 320 remains, to form the gate 360 as shown in FIG. 7C.

Figure 7D:
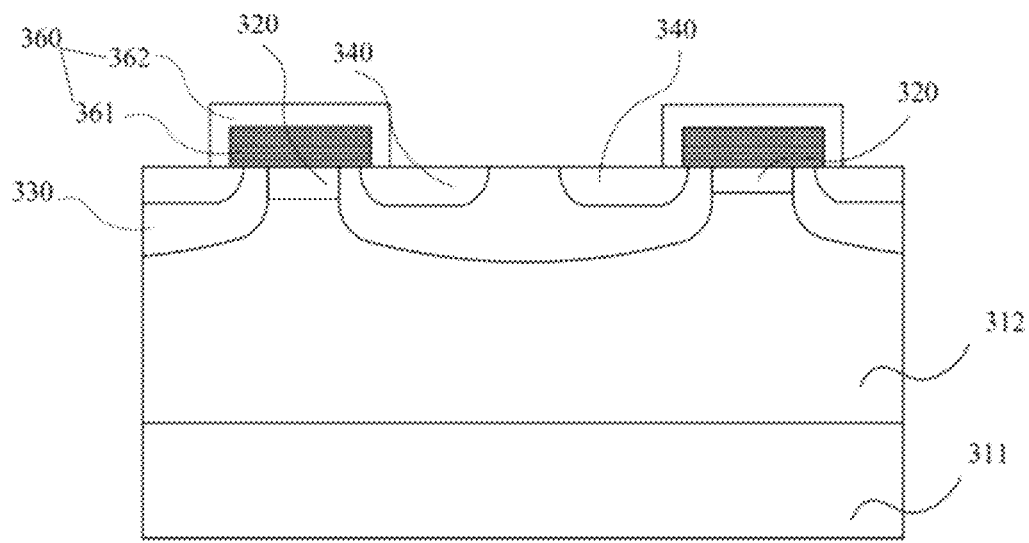

As shown in FIG. 7D, a self-alignment process is performed to implant ions of the second dopant type at a high doping concentration on two sides of each gate 360; a drive-in process and lateral diffusion are also carried out to form well regions 330, which are of the second dopant type. Upper surfaces of the well region 330 are partially in contact with a lower surface of the gate 360. Sidewalls of the well regions 330 are in contact with sidewalls of the JFET region 320, such that second PN junctions and corresponding second depletion layers 132 are formed between the well regions 330 and the JFET region 320.

Ions of the first dopant type are implanted into regions of the well regions 330 that are close to edges of the gate 360 to form source regions 340, which are of the first dopant type. Upper surfaces of the source regions 340 are partially in contact with the lower surface of the gate 360.

Figure 7E:
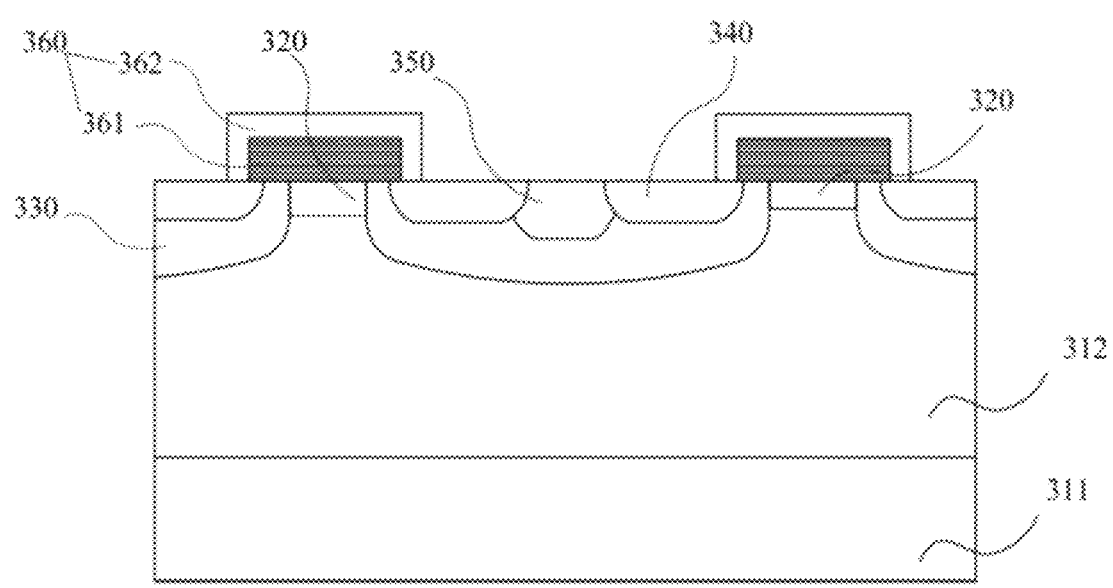

As shown in FIG. 7E, a contact hole is formed between two adjacent gates 360 by etching, and then the contact hole is filled with highly-doped materials to form a contact body region 350, which is of the second dopant type.

Specifically, the upper surface of the well region 330 between two adjacent gates 360 is etched to form the contact hole. Then the contact hole is filled with materials highly doped with ions of the second dopant type, to form the contact body region 350. Sidewalls of the contact body region 350 are in contact with sidewalls of the source region 340.

Figure 7F:
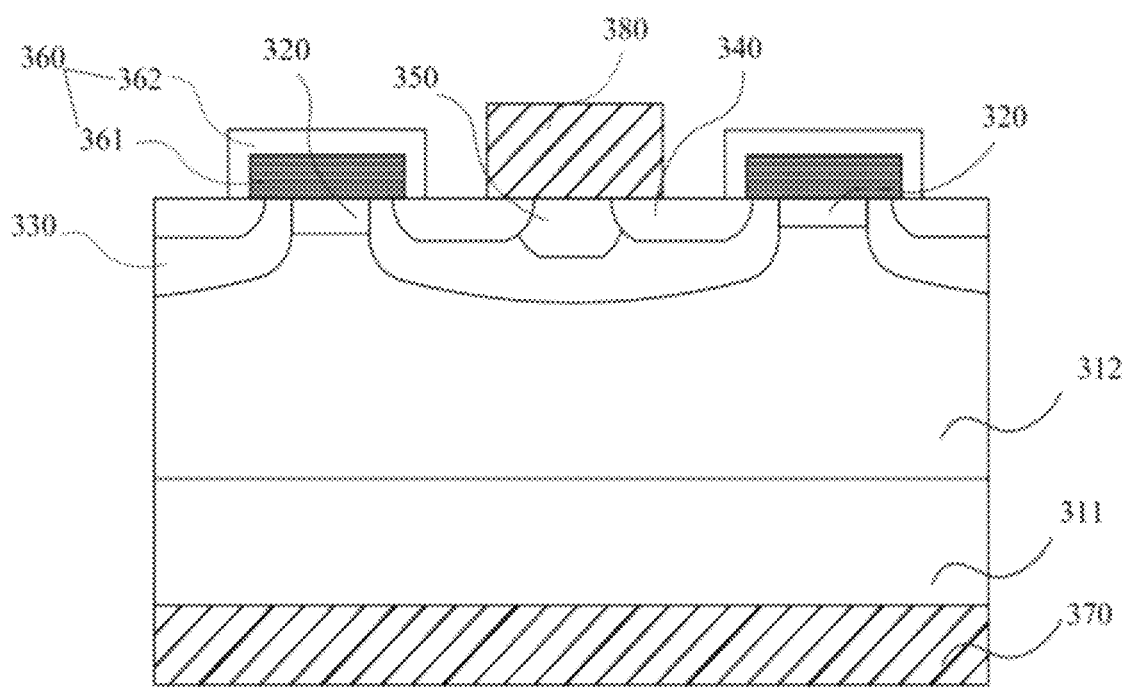

As shown in FIG. 7F, after the contact hole has been formed, metal deposition is performed on an upper surface of the entire intermediate structure to form a metal layer. Then, the metal layer is etched to form a source electrode 380. The source electrode 380 covers the contact body region 350, and partially covers the source regions 340. The substrate 311 is then thinned. After that, a drain electrode 370 is formed on a surface of the substrate 311 facing away from the epitaxial layer 312.

In an embodiment, after the metal layer is formed, a packaging process is performed on the corresponding intermediate structure. The packaging process may include a metal deposition process, such as sputtering, annealing, chemical vapor deposition, a passivation process, or any other existing packaging process.

It is also understood by those of skill in the art that, for the purpose of clear illustration, the elements (e.g., regions, areas, layers, etc.) in each of the accompanying drawings are not necessarily drawn to scale. In addition, the individual elements in the accompanying drawings are not necessarily in their actual shape. For example, in the above embodiments, regions like the source regions, well regions, and JFET regions are all shown with clear boundaries in the cross sections, which are for illustration purposes only; in actual applications, there may be transition zones between regions that are differently doped, and the corresponding gradients of doping concentration may be continuous at boundaries between the regions The above embodiments are illustrative of the principles and benefits of the disclosure rather than restrictive of the scope of the disclosure. Persons skilled in the art can make modifications and changes to the embodiments without departing from the spirit and scope of the disclosure. Therefore, all equivalent modifications and changes made by persons skilled in the art without departing from the spirit and technical concepts disclosed in the disclosure shall still be deemed falling within the scope of the claims of the disclosure.

What is claimed is:

1. A VDMOS (vertical double-diffused metal oxide semiconductor) device, comprising a plurality of unit cells,
wherein the plurality of unit cells jointly form a cellular structure, wherein the cellular structure comprises a plurality of source regions spaced apart from each other and a plurality of gate regions, wherein the plurality of gate regions comprises a first group of gate regions and a second group of gate regions;
wherein each of the plurality of unit cells comprises a semiconductor base comprising a substrate, which is of a first dopant type, and an epitaxial layer disposed on the substrate, wherein the epitaxial layer is of the first dopant type, and wherein the substrate comprises a drain region of the VDMOS device, wherein the JFET region comprises the first dopant type;
wherein the first group of gate regions each extends in a first direction, and the second group of gate regions each extends in a second direction perpendicular to the first direction;
wherein each of the plurality of source regions is positioned between two adjacent ones of the first group of gate regions and two adjacent ones of the second group of gate regions;
wherein each of the first group of gate regions overlaps with one or more of the second group of gate regions, wherein overlapping gate regions are gate intersections, and wherein the gate regions with no overlapping with any other gate regions are non-intersecting gate regions;
wherein the gate intersections each comprises a separation region;
wherein each of the plurality of unit cells comprises a JFET (junction-gate field-effect transistor) region under one of the non-intersecting gate regions and a JFET shielding region under one of the gate intersections, wherein the JFET region has a same dopant type as a dopant type of the JFET shielding region, and wherein the JFET region has a higher doping concentration than a doping concentration of the JFET shielding region which has a same doping concentration as a doping concentration of the epitaxial layer.

2. The VDMOS device of claim 1, wherein boundaries of the separation region are located within boundaries of the gate intersection, wherein each gate intersection has an area equal to or larger than an area of the separation region of said gate intersection.

3. The VDMOS device of claim 2,
wherein the JFET region is formed in the epitaxial layer under one of the non-intersecting gate regions, and wherein the JFET region extends from an upper surface of the epitaxial layer toward the substrate;
wherein the JFET shielding region comprises the first dopant type, wherein the JFET shielding region is formed in the epitaxial layer under one of the gate intersections;
wherein each of the plurality of unit cells further comprises:
a plurality of well regions, which is of a second dopant type, wherein the plurality of well regions is disposed in the epitaxial layer and at side of one of the plurality of gate regions, wherein sidewalls of the plurality of well regions are in contact with sidewalls of the JFET region;
wherein the plurality of source regions comprises the first dopant type, wherein the plurality of source regions is disposed in the plurality of well regions, and wherein the plurality of source regions is positioned proximate to the JFET region;

a contact body region, which is of the second dopant type, wherein the contact body region is disposed in one of the plurality of well regions, wherein sidewalls of the contact body region are in contact with sidewalls of the plurality of source regions;

a gate, disposed in one of the gate regions on an upper surface of the epitaxial layer, wherein the gate comprises a gate electrode and a gate dielectric layer, wherein the gate is in contact with the JFET region, one of the plurality of well regions, and one of the plurality of source regions;

source electrodes, wherein the source electrodes are metal layers connecting to the plurality of source regions and the contact body region; and drain electrodes, disposed on a surface of the substrate facing away from the epitaxial layer.

4. The VDMOS device of claim 3, wherein the JFET shielding region is a part of the epitaxial layer.

5. The VDMOS device of claim 3, wherein the plurality of well regions has a higher doping concentration than the doping concentration of the JFET region.

6. The VDMOS device of claim 3, wherein a difference between the doping concentration of the plurality of well regions and the JFET region is less than a difference between the doping concentration of the plurality of well regions and the doping concentration of the epitaxial layer.

7. The VDMOS device of claim 3, wherein a depth of the JFET region along a direction in which the JFET region extends toward the substrate is not greater than a depth of the plurality of well regions.

* * * * *